United States Patent [19]
Yoshida et al.

[11] Patent Number: 5,636,074
[45] Date of Patent: Jun. 3, 1997

[54] RECORDING SIGNAL AMPLIFIER APPARATUS

[75] Inventors: Teruyuki Yoshida; Keiko Kanetsuka, both of Kanagawa, Japan

[73] Assignee: Sony Corporation, Japan

[21] Appl. No.: 795,470

[22] Filed: Nov. 21, 1991

[30]  Foreign Application Priority Data

Nov. 27, 1990  [JP]  Japan ................... 2-327198

[51] Int. Cl.$^6$ .......................................... G11B 5/09
[52] U.S. Cl. ................................. 360/46; 360/68
[58] Field of Search ........................ 360/46, 67, 68

[56]  References Cited

U.S. PATENT DOCUMENTS

| | | | |
|---|---|---|---|
| 4,639,794 | 1/1987 | Ferrier | 360/46 |
| 4,757,394 | 7/1988 | Okamoto et al. | 360/70 |

FOREIGN PATENT DOCUMENTS

| | | |
|---|---|---|
| 0345037 | 12/1989 | European Pat. Off. . |
| 0390554 | 10/1990 | European Pat. Off. . |
| 3715884 | 11/1987 | Germany . |
| 3642316 | 6/1988 | Germany . |
| 3831527 | 4/1990 | Germany ................... 360/67 |
| 0077015 | 6/1980 | Japan ........................ 360/46 |

OTHER PUBLICATIONS

*Electronic Engineers' Handbook*, Donald G. Fink, 2nd Ed., ©1982 by McGraw-Hill, Inc. NY, pp. 13-16 –13-17.

*Primary Examiner*—H. Psitos
*Attorney, Agent, or Firm*—Ronald P. Kananen

[57]  ABSTRACT

A recording amplifier apparatus comprises first and second differential amplification means connected to each other with wires. The second differential amplification means is disposed close to a rotary drum by extending the wires. It is thus possible to restrain generation of a distributed capacity by the wires to a minimum.

12 Claims, 2 Drawing Sheets

RECORDING SIGNAL AMPLIFIER APPARATUS

BACKGROUND OF THE INVENTION

This invention relates to a signal recording amplifier apparatus and is suitable for an application to the recording amplifier circuit of, e.g., a data recording device for recording, particularly, information data on a magnetic tape with a rotary head.

There has in the prior art existed a data recording device for recording the information data with a high density by use of a digital video tape recorder based on a helical scan method.

More specifically, as illustrated in FIG. 1, in such a data recording device 1, the information data is coded by, e.g., an 8–9 modulation method. A record signal S0 obtained as a consequence of this coding is equalized by an equivalent circuit and at the same time amplified by a recording amplifier circuit 2. The information data is then supplied to a rotary head 4 mounted on a drum.

The drum is wound with a magnetic tape 5 to permit its running in an oblique direction. The rotary head 4 thereby scans the magnetic tape 5 by the helical scan method.

Note that the reference LS of a rotary transformer 3 designates a loss caused by the rotary transformer 3, while the reference LH of the rotary head 4 represents a total inductance of the rotary transformer 3 and the rotary head 4.

A capacity CH indicates a distributed capacity generated by the wires and the rotary transformer 3 in addition to an output capacity of the recording amplifier circuit 2 itself.

As a result, in the data recording device 1, a resonance circuit is formed by the capacity CH and the inductance LH of the head 4. In consequence, as illustrated in FIG. 2, there is produced a rise in terms of an amplitude characteristic in the vicinity of a maximum frequency f1 of a frequency characteristic T0, as seen by the solid line.

For this reason, in the data recording device 1, a dumping resistance RH, one terminal of which is grounded, is connected to an output terminal of the recording amplifier circuit 2. The frequency characteristic T1 as shown by the dashed line in FIG. 2, is thereby obtained, wherein the rise in the amplitude characteristic in the vicinity of to the maximum frequency f1 is compensated as much as possible.

According to this data recording device 1, in this manner, the information data is recorded typically at a data rate of 88 Mbps (consisting of record maximum frequency 44 MHz). Formed on a recording track of the magnetic tape 5 is a magnetizing pattern which is reversed at the shortest interval of 0.9 μm.

In this type of the data recording device 1, a rotating speed of the rotary head 4 and a running speed of the magnetic tape 5 are controlled. A relative speed between the rotary head 4 and the magnetic tape 5 in the direction of the recording track is thereby variably-controlled at a speed of ¹⁄₁, ½, ¼, ⅛, ¹⁄₁₆ and ¹⁄₂₄ times respectively. Recorded are the information data having data rates 88, 44, 11, and, 3.67 Mbps , i.e., the record signals S0 having record maximum frequencies 44, 22, 11, 5.50, 2.50, and 1.84 MHz.

Namely, with respect to the information data recorded by the record signal having the record maximum frequency 44 MHz and the data rate of 88 Mbps, the relative speed between the magnetic tape 5 and the rotary head 4 in the recording track direction is variably-controlled at the speed of ½ times. This information data is readable as a piece of information data having the data rate 44 Mbps, i.e., the record maximum frequency of 22 MHz. A low speed reproduction at a ½-fold speed is thereby attainable.

Reversely, with respect to the information data recorded by the record signal S0 having the data rate 22 Mbps and the recording maximum frequency 11 MHz, the relative speed is variably-controlled at the speed of ¹⁄₁ times. The information data is readable as a piece of information data having the data rate 88 [Mbps], viz., the record maximum frequency 44 [MHz]. As a result, a high speed reproduction is thereby attainable at a 4-times speed.

As a matter of fact, in the case of the data recording device 1, a variable-speed recording is, as described above, effected at a speed of ¹⁄₁ through ¹⁄₂₄ times. Therefore, with respect to, e.g., observation data which varies slowly as in the case of astronomical observation, the data is recorded at a data rate as slow as 3.67 Mbps and reproduced at a data rate as high as 88 Mbps. The data is thereby efficiently analyzed in a short time by using a computer system.

In contrast with this, with respect to measurement data or observation data which varies quickly, the data is recorded at the data rate as high as 88 Mbps and reproduced at the data rate as slow as 3.67 Mbps. The data can be surely analyzed at a low speed. With this arrangement, the data recording device 1 is usable as a buffer for a frequency conversion of the information data containing a large amount of information.

In the thus constructed data recording device 1, however, the waveform-equalized record signal is amplified, or alternatively the recording signals itself contains low frequency components. Hence, a so-called linear amplifier circuit exhibiting a linear amplification characteristic is employed as the recording amplifier circuit 2. As explained above, the recording amplifier circuit 2 composed of the linear amplifier circuit includes a typically large-scale circuit. It is therefore difficult to place the circuit in close proximity to a drum on which a magnetic tape running system, such as a capstan and a guide roller, exists. In the data recording device 1, wires on the output side of the recording amplifier circuit 2 are extended.

If the wires on the output side of the recording amplifier circuit 2 are extended, a value of the distributed capacity CH increases correspondingly. In addition to the rise in the frequency characteristic T0 due to the resonance, there arises a problem in which, as expressed in the following formula, the pass frequency characteristic fH can not be extended.

$$fH = \frac{1}{2\pi\sqrt{(LS+LH)\cdot CH}} \quad (1)$$

Such a problem becomes more conspicuous especially in the data recording device for performing multichannel recording. It is because the recording amplifier circuits corresponding to the number of channels are needed, and the wires have to be extended long corresponding thereto.

SUMMARY OF THE INVENTION

In view of the foregoing, an object of the present invention is to provide a signal recording amplifier circuit capable of restraining a generation of the distributed capacity by wires down to the minimum irreducible by obviating the prior art problems en.

The foregoing object and other objects of the present invention have been achieved by the provision of a signal recording amplifier apparatus wherein a recording amplifier circuit 11 amplifies and supplies recording signals S10, S11 to a rotary head 4 mounted on a drum wound with a magnetic tape 5, comprising: a first differential amplification means 11A consisting of first and second transistors Q3, Q4 having bases to which the record signals S10, S11 are inputted, emitters supplied with constant currents and collectors at which amplification outputs are obtained; and a second differential amplification means 11B consisting of third and fourth transistors Q6, Q7, having emitters connected to the collectors of the first and second transistors Q3, Q4 and bases held at a constant potential, for supplying collector outputs to the rotary head 4, whereby the second amplification means 11B is disposed in close proximity to the drum by extending wires 13 between the collectors of the first and second transistors Q3, Q4 and the emitters of the third and fourth transistors Q6, Q7.

Extended are the wires 13 between the collectors of the first and second transistors Q3, Q4 constituting the first differential amplification means 11A and the emitter of the third and fourth transistors Q6, Q7 constituting the second differential amplification means 11B, the foregoing first means having the bases to which the record signals S10, S11 are inputted and the emitters supplied with the constant current. The second differential amplification means 11B is disposed in close proximity to the drum, whereby the generation of the distributed capacity by the wires 13 can be restrained down to a minimum.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 1:
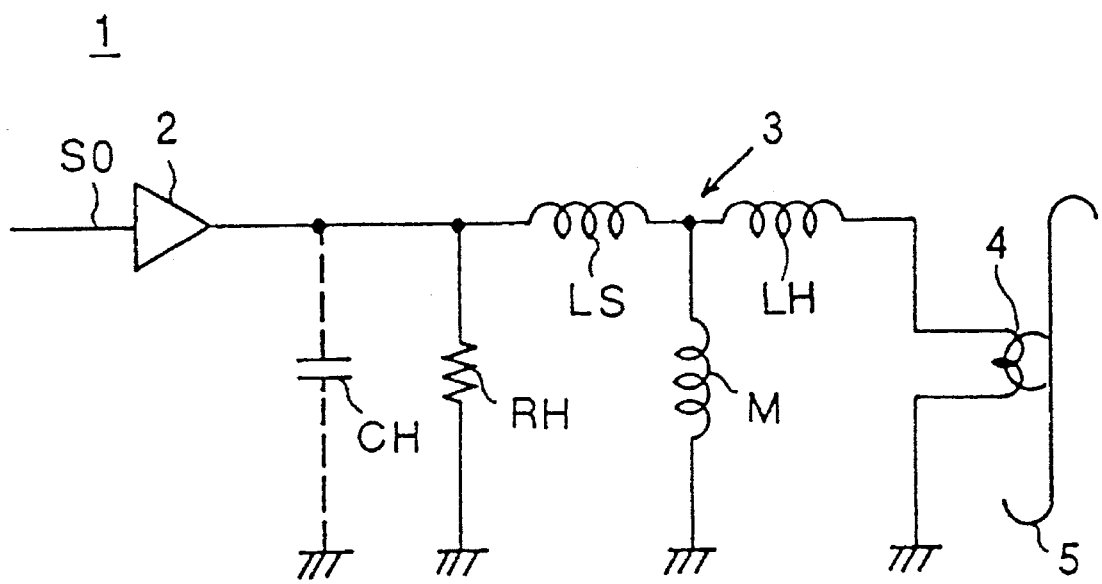
FIG. 1 is a connection diagram illustrating a conventional data recording device.
Figure 2:
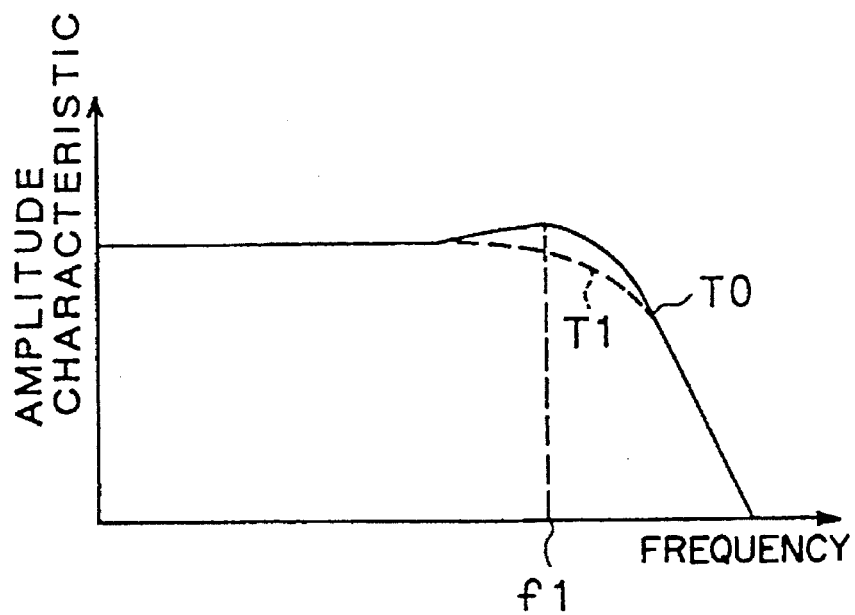
FIG. 2 is a characteristic curve diagram for assistance in explaining a frequency characteristic thereof.
Figure 3:
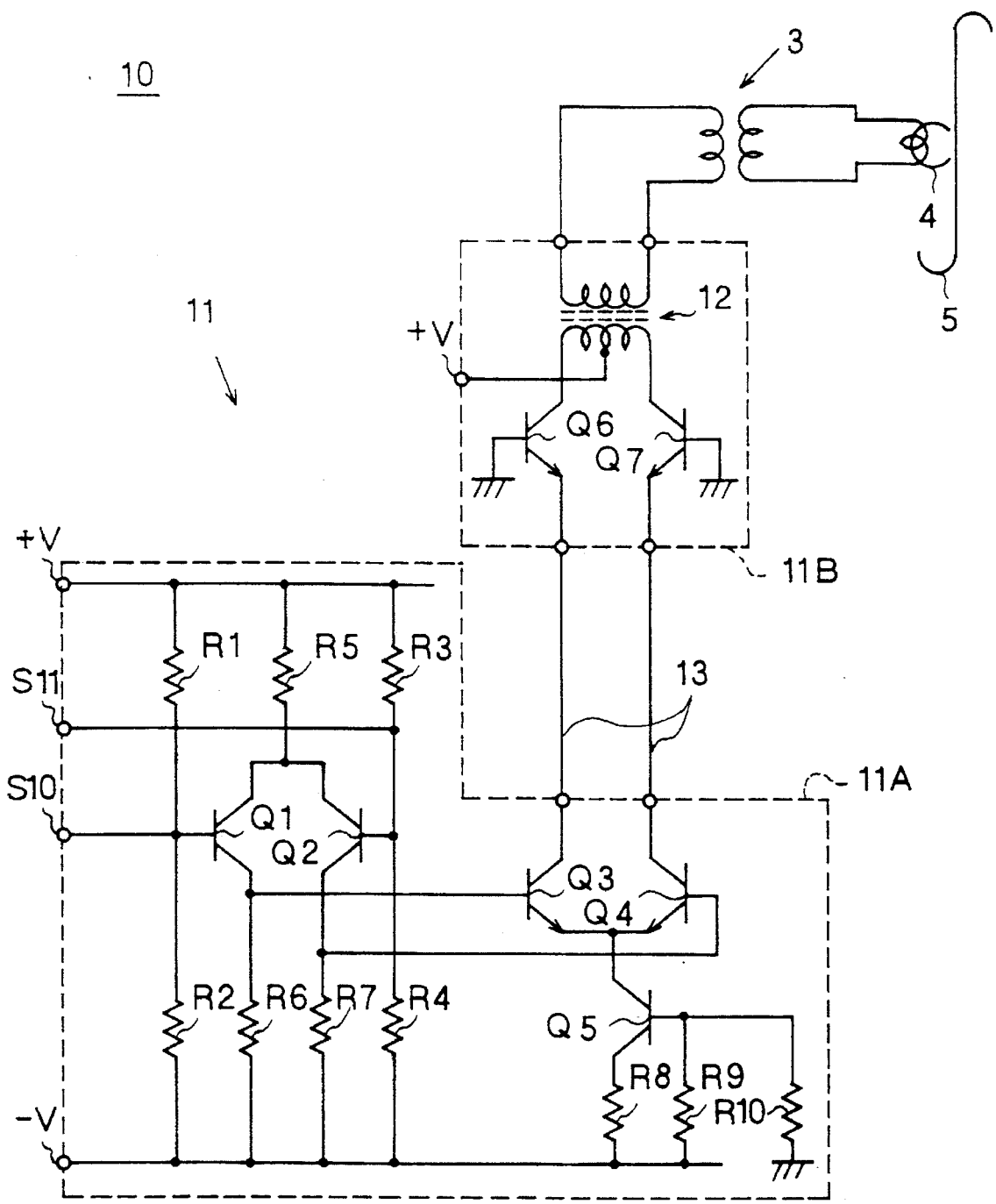
FIG. 3 is a connection diagram showing one embodiment of a data recording device according to this invention.

Preferred embodiments of the present invention will be described with reference to the accompanying drawings:

Referring to FIG. 3, wherein the elements corresponding to those in FIG. 1 are marked with the same symbols, the numeral 10 generally represents a data recording device using a recording amplifier circuit 11 according to this invention. A recording signal S10 and its inversion signal S11 are inputted to bases of first and second PNP transistors Q1 and Q2 in which an input buffer is configured by a differential transistor coupling via connection of these basis to midpoints of resistances R1, R2, R3 and R4 each connected between a positive power source +V and a negative power source −V.

Emitters of the first and second transistors Q1 and Q2 are connected in common and further connected via the resistance R5 to the positive power source +V. Collectors thereof are connected via resistors R6 and R7 to the negative power source −V.

With this arrangement, collector voltages are outputted to collectors of the first and second transistors Q1 and Q2, wherein these voltages correspond to the recording signal S10 and the inversion signal S11 to be inputted thereto. The collector voltages are inputted to bases of third and fourth NPN transistors Q3 and Q4 in which a linear amplifier circuit is configured by a differential transistor coupling.

Emitters of the third and fourth transisors Q3 and Q4 are connected in common and further to a collector of an NPN transistor Q5 constituting a constant current source. Note that the emitter of the transistor Q5 is connected via a resistor R8 to the negative power source −V, while a base thereof is connected via a resistor R9 to the negative power source −V and at the same time grounded via a resistor R10.

Outputted resultantly from collectors of the third and fourth transistors Q3 and Q4 are collector currents obtained by amplifying the collector voltages of the first and second transistors Q1 and Q2, i.e., the recording signal S10 and the inversion signal S11 thereof at a predetermined amplification factor.

The collector currents of the third and fourth transistors Q3 and Q4 are inputted to emitters of sixth and seventh NPN transistors Q6 and Q7 consisting of a differential transistor coupling and cascade-connected to the third and fourth transistors Q3 and Q4, respectively.

As a matter of fact, the third and fourth transistors Q3 and Q4 are thus connected to the sixth and seventh transistors Q6 and Q7, thereby constituting a cascade type differential amplifier circuit.

The sixth and seventh transistors Q6 and Q7 are base-grounded, whereby an output buffer is configured. Collector currents outputted from the respective collectors are supplied to both ends of a primary winding of an output transformer 12, the midpoint of which is supplied with the positive power source +V.

A secondary winding of this output transformer 12 is connected to a primary winding of a rotary transformer 3. In this manner, the recording signal S10 is amplified at the predetermined amplification factor in the record amplifier circuit 11. The recording signal S10 is then fed to the rotary head 4 via the rotary transformer 3, thereby recording the recording signal S10 on the magnetic tape 5.

Extended in the case of this embodiment are wires 13 between the collectors of the third and fourth transistors Q3 and Q4 which constitute a cascade type differential amplifier circuit and the emitters of the sixth and seventh transistors Q6 and Q7. The recording amplifier circuit 11 is divided into an amplifier circuit unit 11A and an output buffer unit 11B.

Of these units, the amplifier circuit unit 11A based on large-sized circuitry including the third and fourth transistors Q3 and Q4 is formed on the same substrate as the circuit substrate of other recording system. In contrast with this, the output buffer unit 11B including the sixth and seventh transistors Q6 and Q7 is formed on a small-sized substrate disposed in close proximity to the drum (i.e., to the rotary transformer 3).

In effect, as in the manner given above, when extending the wires 13 between the collectors of the third and fourth transistors Q3 and Q4 and the emitters of the sixth and seventh transistors Q6 and Q7, there is generated a distributed capacity of approximately 10 pF per 10 cm.

In the case of this embodiment, however, the sixth and seventh transistors Q6 and Q7 are base-grounded. Hence, impedances between the collectors of the third and fourth transistors Q3 and Q4 and the emitters of the sixth and seventh transistors Q6 and Q7 become almost zero. As a result, the distributed capacity by the wires 13 is ignorable. The wires 13 are thereby freely extendible.

The output buffer unit 11B of the recording amplifier circuit 11 is disposed in close proximity to the drum (viz., the rotary transformer 3). It is therefore possible to restrain generation of the distributed capacity by the wires down to a minimum. There can be attained the recording amplifier circuit 11 capable of restraining a rise in frequency characteristic due to the resonance an extending a pass frequency characteristic fH.

Extended based on the construction discussed above are the wires 13 between the collectors of the third and fourth transistors Q3 and Q4 and the emitters of the sixth and seventh transistors Q6 and Q7. the output buffer unit 11B including the sixth and seventh transistors Q6 and Q7 is placed close to the drum, thereby actualizing the recording amplifier circuit 11 capable of restraining the generation of the distributed capacity by the wires down to a minimum.

Consequently, it is feasible to obtain the recording amplifier circuit optimal to recording of the digital signal by helical-scanning of the magnetic tape 5 with the rotary head 4.

In the embodiment discussed above, the present invention is applied to the data recording device. This invention is not, however, limited to this device, but is also suitable for an application widely to the record amplifier circuits of recording/reproducing devices such as, e.g., digital video tape recorders, digital audio tape recorders, and the like.

As explained above, according to the present invention, wires between the collectors of the differential amplification means and the emitters of the second differential amplification means are extended, the foregoing first means having the bases to which the record signals are inputted and the emitters supplied with the constant currents, and the foregoing second means having the bases held at a constant potential. The second differential amplification means is disposed in close proximity to the drum. It is therefore possible to attain the recording amplifier circuit capable of restraining generation of the distributed capacity by the wires to a minimum.

What is claimed is:

1. A recording signal amplifier apparatus wherein a recording signal is amplified and supplied to a rotary head mounted on a rotary drum wound with a magnetic tape, comprising:

first differential amplification means consisting of first and second transistors which have bases to which said recording signal to be amplified is inputted, emitters supplied with constant currents, and collectors from which amplification outputs related to said recording signal are obtained; and second differential amplification means consisting of third and fourth transistors which have emitters connected to said collectors of said first and second transistors for receiving said amplification outputs related to said recording signal, and bases provided with a constant potential, collector outputs of said third and fourth transistors relating to said recording signal being supplied to said rotary head;

said second differential amplification means being disposed in close proximity to said rotary drum by extending wires between said collectors of said first and second transistors and said emitters of said third and fourth transistors, and said first differential amplification means being disposed at a location more remote from said rotary drum than said second differential amplification means, whereby an effect of capacitance of said wires is reduced, wherein said second differential amplification means is provided on another circuit substrate separate from a substrate for said first differential amplification means, which is connected with said second differential amplification means via an exclusive cable including said wires.

2. The recording signal amplifier apparatus according to claim 1, wherein a third differential amplification means which consists of said fifth and sixth transistors is provided as a front stage of said first differential amplification means, wherein bases of said fifth and sixth transistors are supplied with said record signals, and collectors of said fifth and sixth transistors are connected to said bases of said first and second transistors.

3. The recording signal amplifier apparatus according to claim 1, wherein said recording signal is a digitized data signal.

4. A recording signal amplifier apparatus wherein a recording signal is amplified and supplied to a rotary head mounted on a rotary drum wound with a magnetic tape, comprising:

first differential amplification means consisting of first and second transistors which have bases to which said recording signal to be amplified is inputted, emitters supplied with constant currents, and collectors from which amplification outputs related to said recording signal are obtained; and second differential amplification means consisting of third and fourth transistors which have emitters connected to said collectors of said first and second transistors for receiving said amplification outputs related to said recording signal, and bases provided with a constant potential, collector outputs of said third and fourth transistors relating to said recording signal being supplied to said rotary head;

said second differential amplification means being disposed in close proximity to said rotary drum by extending wires between said collectors of said first and second transistors and said emitters of said third and fourth transistors, and said first differential amplification means being disposed at a location more remote from said rotary drum than said second differential amplification means, whereby an effect of capacitance of said wires is reduced, wherein said second differential amplification means includes an output transformer, a midpoint of a primary winding of which is connected to a power source, wherein both ends of said primary winding of said output transformer are respectively connected to collectors of said third and fourth transistors, a secondary winding of said output transformer is connected to a fixed-side winding of a rotary transformer rotating with said rotary head, and said collector outputs of said second differential amplification means are applied to said rotary head through said output transformer and said rotary transformer.

5. A recording signal amplifier apparatus, comprising:

a source of input signals to be recorded by a rotary head mounted on a rotary drum wound with a magnetic tape;

a first differential amplifier means having a first and a second transistor each having a base to which signals representative of said input signals are inputted, an emitter supplied with a constant current signal, and a collector from which an output signal representative of an amplified output of said signals representative of said input signals are obtained, said first differential amplifier means being located at a location relatively remote from said rotary drum;

a second differential amplifier means having a third and a fourth transistor each having an emitter respectively connected to a collector of said first and said second transistors in said first differential amplifier means by wires for receiving said output signal representative of an amplified output of said signals representative of said input signals, a base provided with a constant potential, and a collector from which outputs of said third and fourth transistors representative of said input signals are provided to said rotary head, said second differential amplifier means being located at a location nearer to said rotary drum than said first differential amplifier means, said wires being extended between said emitters of said third and fourth transistors to said collectors of said first and second transistors, whereby an effect of distributed capacitance of said wires is reduced, wherein said second differential amplification means is provided on another circuit substrate separated from a substrate for said first differential amplification means, which is connected with said second differential amplification means via an exclusive cable including said wires.

6. The recording signal amplifier apparatus according to claim 5, wherein third differential amplification means which consists of said fifth and sixth transistors is provided as a front stage of said first differential amplification means, wherein bases of said fifth and sixth transistors are supplied with said record signals, and collectors of said fifth and sixth transistors are connected to said bases of said first and second transistors.

7. The recording signal amplifier apparatus according to claim 5, wherein said recording signal is a digitized data signal.

8. A recording signal amplifier apparatus, comprising:

a source of input signals to be recorded by a rotary head mounted on a rotary drum wound with a magnetic tape;

first differential amplifier means having a first and a second transistor each having a base to which signals representative of said input signals are inputted, an emitter supplied with a constant current signal, and a collector from which an output signal representative of an amplified output of said signals representative of said input signals are obtained, said first differential amplifier means being located at a location relatively remote from said rotary drum;

a second differential amplifier means having a third and a fourth transistor each having an emitter respectively connected to a collector of said first and said second transistors in said first differential amplifier means by wires for receiving said output signal representative of an amplified output of said signals representative of said input signals, a base provided with a constant potential, and a collector from which outputs of said third and fourth transistors representative of said input signals are provided to said rotary head, said second differential amplifier means being located at a location nearer to said rotary drum than said first differential amplifier means, said wires being extended between said emitters of said third and fourth transistors to said collectors of said first and second transistors, whereby an effect of distributed capacitance of said wires is reduced, wherein said second differential amplification means includes an output transformer, a midpoint of a primary winding of which is connected to a power source, wherein both ends of said primary winding of said output transformer are respectively connected to collectors of said third and fourth transistors, a secondary winding of said output transformer is connected to a fixed-side winding of a rotary transformer rotating with said rotary head, and said collector outputs of said second differential amplification means are applied to said rotary head through said output transformer and said rotary transformer.

9. A recording signal amplifier apparatus, comprising:

a rotary drum about which a magnetic tape is wound;

a rotary head mounted on said rotary drum said and having a rotary transformer with a movable coil and a fixed coil;

a transformer having its secondary connected to said fixed coil of said rotary transformer;

a source of input signals to be recorded by a rotary head mounted on a rotary drum wound with a magnetic tape;

a first differential amplifier means having a first and a second transistor each having a base to which signals representative of said input signals are inputted, an emitter supplied with constant current signal, and a collector from which an output signal representative of an amplified output of said signals representative of said input signals are obtained, said first differential amplifier means being located at a location relatively remote from said rotary drum;

a second differential amplifier means having a third and a fourth transistor each having an emitter respectively connected to a collector of said first and said second transistors in said first differential amplifier means by wires, a base provided with a constant potential, and a collector from which outputs of said third and fourth transistors are provided to said rotary head, said second differential amplifier means being located at location nearer to said rotary drum than said first differential amplifier means, said wires being extended between said emitters of said third and fourth transistors to said collectors of said first and second transistors, whereby a effect of distributed capacitance of said wires is reduced, wherein said second differential amplification means is provided on another circuit substrate separated from a substrate for said first differential amplification means, which is connected with said second differential amplification means via an exclusive cable including said wires.

10. The recording signal amplifier apparatus according to claim 9, wherein a third differential amplification means which consists of said firth and sixth transistors is provided as a front stage of said first differential amplification means, wherein bases of said fifth and sixth transistors are supplied with said record signals, and collectors of said fifth and sixth transistors are connected to bases of said first and second transistors.

11. The recording signal amplifier apparatus according to claim 9, wherein said recording signal is a digitized data signal.

12. A recording signal amplifier apparatus, comprising:

a rotary drum about which a magnetic tape is wound;

a rotary head mounted on said rotary drum and having a rotary transformer with a movable coil and a fixed coil;

a transformer having its secondary connected to said fixed coil of said rotary transformer;

a source of input signals to be recorded by a rotary head mounted on a rotary drum wound with a magnetic tape;

a first differential amplifier means having a first and a second transistor each having a base to which signals representative of said input signals are inputted, an emitter supplied with constant current signal, and a collector from which an output signal representative of an amplified output of said signals representative of said input signals are obtained, said first differential amplifier means being located at a location relatively remote from said rotary drum;

a second differential amplifier means having a third and a fourth transistor each having an emitter respectively connected to a collector of said first and said second transistors in said first differential amplifier means by wires, a base provided with a constant potential, and a collector from which outputs of said third and fourth transistors are provided to said rotary head, said second differential amplifier means being located at a location nearer to said rotary drum than said first differential amplifier means, said wires being extended between said emitters of said third and fourth transistors to said collectors of said first and second transistors, whereby an effect of distributed capacitance of said wires is reduced, wherein said second differential amplification means including an output transformer, a midpoint of a primary winding of Which is connected to a power source, wherein both ends of said primary winding of said output transformer are respectively connected to collectors of said third and fourth transistors, a secondary winding of said output transformer is connected fixed-side winding of a rotary transformer rotating with said rotary head, and said collector outputs of said second differential amplification means are applied to said rotary head through said output transformer and said rotary transformer.

* * * * *